(12) United States Patent
Bharadwaj et al.

(10) Patent No.: US 12,301,262 B2
(45) Date of Patent: May 13, 2025

(54) ON-BOARD AUTOENCODER FOR VEHICLES

(71) Applicant: Mercedes-Benz Group AG, Stuttgart (DE)

(72) Inventors: Vikram Bharadwaj, Sunnyvale, CA (US); Aaron Brown, Sunnyvale, CA (US); Thomas Monninger, Sunnyvale, CA (US)

(73) Assignee: Mercedes-Benz Group AG, Stuttgart (DE)

( * ) Notice: Subject to any disclaimer, the term of this patent is extended or adjusted under 35 U.S.C. 154(b) by 168 days.

(21) Appl. No.: 18/107,651

(22) Filed: Feb. 9, 2023

(65) Prior Publication Data
US 2024/0275403 A1    Aug. 15, 2024

(51) Int. Cl.
*H03M 7/30*    (2006.01)
*G01C 21/00*   (2006.01)
*H04N 19/426*  (2014.01)

(52) U.S. Cl.
CPC ....... *H03M 7/6011* (2013.01); *G01C 21/3815* (2020.08); *G01C 21/3848* (2020.08); *H03M 7/70* (2013.01); *H04N 19/426* (2014.11)

(58) Field of Classification Search
CPC ... H03M 7/6011; H03M 7/70; G01C 21/3815; G01C 21/3848; H04N 19/426
See application file for complete search history.

(56) References Cited

U.S. PATENT DOCUMENTS

| | | | |
|---|---|---|---|
| 2018/0293466 A1* | 10/2018 | Viswanathan | G01C 21/3602 |
| 2018/0336468 A1 | 11/2018 | Kadav | |
| 2021/0286923 A1* | 9/2021 | Kristensen | G01S 7/412 |
| 2023/0378976 A1* | 11/2023 | Mizutani | G08C 15/00 |

FOREIGN PATENT DOCUMENTS

| | | |
|---|---|---|
| CN | 110188827 | 11/2020 |
| CN | 109829399 | 7/2022 |
| WO | WO2021175615 | 9/2021 |

* cited by examiner

*Primary Examiner* — Russell Frejd
*Assistant Examiner* — Ana D Thomas
(74) *Attorney, Agent, or Firm* — Mahamedi IP Law LLP

(57) ABSTRACT

A vehicle computing system can receive sensor data from a sensor suite of the vehicle. The system can execute a autoencoder on the sensor data to compress the sensor data, and can stored the compressed sensor data in an on-board database of the vehicle.

20 Claims, 7 Drawing Sheets

ON-BOARD AUTOENCODER FOR VEHICLES

BACKGROUND

Methods for autonomous vehicle mapping of a road network can involve scene understanding and object detection tasks based on sensor data recorded by vehicles operating throughout the road network. Lossy data compression techniques enable significantly increased amounts of data reduction as compared to lossless compression while still meeting the requirements of a particular application, and can involve spatial dimensional reduction and the discarding of certain data.

SUMMARY

Systems, methods, and computer programs products are described for efficiently compressing and storing sensor data on-board vehicles. In various implementations, each of the vehicles can include a sensor suite comprising a set of image sensors (e.g., cameras), LIDAR sensors, radar sensors, and the like. As such, the sensor data can comprise a combination of image data, radar data, and LIDAR data. Each of the vehicles can record sensor data using the sensor suite. According to examples described herein, the vehicle can include a computing system that includes an autoencoder. The vehicle computing system can receive sensor data from the sensor suite of the vehicle, and can execute the autoencoder on the sensor data to encode and compress the sensor data. The computing system may then store the compressed sensor data in an on-board database of the vehicle.

In various examples, the autoencoder can be machine learned based on a set of tasks of a set of learnable decoders that decompress the compressed sensor data on a backend computing system. These tasks performed by the learnable decoders can comprise scene reconstruction tasks, scene understanding tasks, object detection tasks, and various other tasks for training autonomous vehicles and/or generate autonomous driving maps of a road network on which the vehicles operate. In certain cases, the learnable decoders can comprise a series of neural network layers on the backend computing system that perform the scene reconstruction tasks, scene understanding tasks, object detection tasks, and other downstream tasks.

According to embodiments described herein, the autoencoder executing on each vehicle operating throughout the road network can automatically remove data in the compressed sensor data based on the set of tasks of the learnable decoders that execute on the backend computing system. For example, the learnable decoders on the backend computing system may be utilized for the purpose of training autonomous vehicles or generating autonomy maps for autonomous vehicle operation on the road network. For effective autonomous driving, compressed sensor comprising data road network details—such as traffic signage, road-painted rule markings, traffic signals, lane markings, parking spaces, sidewalks, other right-of-way rule indicators, points-of-interest used for localization and pose purposes, and the like—may be preserved by the autoencoder. Other information that is not needed for scene reconstruction, scene understanding, and other decoder purposes—such as background landscapes, building façades, foliage, etc.—may be automatically discarded by the autoencoder.

In various implementations, the autoencoder can compress the sensor data and store the compressed sensor data in real time to (i) increase data storage in the on-board database of the vehicle, and (ii) increase bandwidth efficiency when uploading the compressed sensor data to the backend computing system. In further implementations, the compressed sensor data by the autoencoder can comprise a representation of sensor fusion-based data based on the combination of image data, radar data, and LIDAR data generated by the sensor suite of the vehicle. As provided herein, the vehicle can comprise a fleet vehicle operated by a consumer-driver, or a specialized mapping vehicle that collects sensor data of a road network for generating autonomy maps for autonomous vehicle operation on the road network. In some examples, an automotive manufacturer that manufactures consumer vehicles with sensor suites that include image sensors, LIDAR sensors, and/or radar sensors, as well as autoencoders, can continuously update autonomy maps based on the compressed sensor data recorded by those consumer vehicles during normal operation on the road network.

In various examples, a backend computing system can receive the compressed, encoded sensor data from the databases of the vehicles and can execute a set of learnable decoders on the compressed sensor data to decompress the data in accordance with the set of tasks of the learnable decoders. As provided herein, the set of tasks of the learnable decoders can comprise scene reconstruction tasks, scene understanding tasks, object detection and classification tasks, and other autonomous driving related tasks. As an example, the compressed sensor data stored on-board the vehicles can comprise two-dimensional sensor fusion images of the surrounding environment of the vehicles as they operate throughout the road network. These fused images may have been compressed by the autoencoder such that vastly more information about the road network may be stored on-board for later decoding and/or scene reconstructing by the decoders of the backend computing system.

In some examples, scene reconstruction by the decoders can comprise neural radiance field (NeRF) reconstruction, in which complex three or four-dimensional scenes can be generated based on sets of two-dimensional images. In various examples, the set of learnable decoders can include a series of neural network layers on the backend computing system to perform scene reconstruction tasks, scene understanding tasks, instance segmentation tasks, localization tasks, and/or object detection tasks using the encoded, sensor fusion-based data that include combinations of image data, radar data, LIDAR data, and/or any other sensor data.

BRIEF DESCRIPTION OF THE DRAWINGS

The disclosure herein is illustrated by way of example, and not by way of limitation, in the figures of the accompanying drawings in which like reference numerals refer to similar elements, and in which.

DETAILED DESCRIPTION

Figure 1:
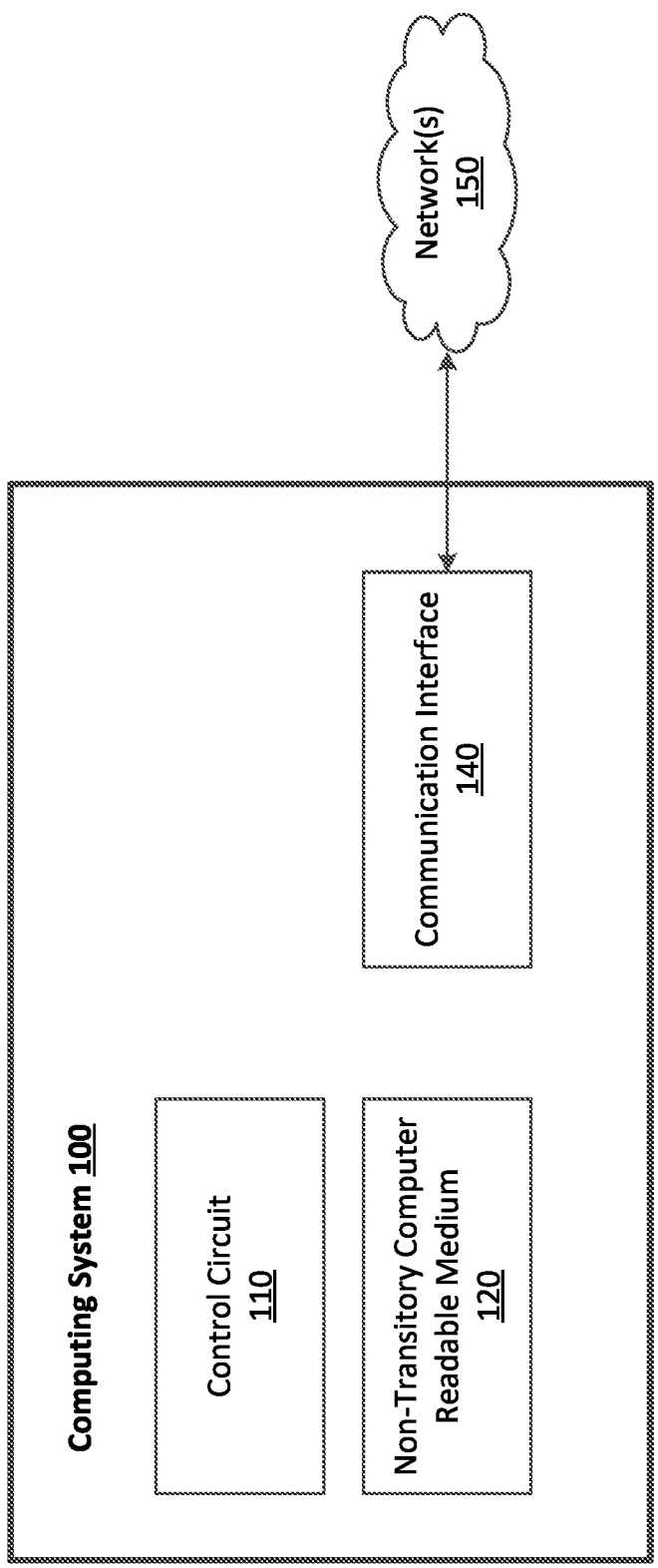
FIG. 1 is a block diagram depicting an example computing system implementing data compression and/or learnable decoding methods for tasks such as scene reconstruction and understanding, according to examples described herein.

On-board computing systems of vehicles have limited data storage for collecting sensor data for training machine learning models. On the front end, vehicles comprising sensor suites can operate along road network routes to collect sensor data. On the backend, a computing system can comprise a series of neural network layers (e.g., represented by a set of "learnable" decoders) that enable a set of machine learning models to perform scene understanding, object detection, scene reconstruction, and/or simulation tasks for semi-autonomous and/or fully autonomous driving purposes. As described herein, the sensor suites on-board the vehicles can include multiple sensor types, such as LIDAR sensors, cameras, radar sensors, and the like. In current implementations, uploading raw sensor data to backend computing system can require lengthy upload times and is generally bandwidth inefficient. Thus, examples described throughout the present disclosure involve data compression techniques to significantly increase usable data stored on-board the vehicles, which can reduce upload times and result in significant bandwidth efficiency as compared to current implementations.

As provided herein, each vehicle can encode collected sensor data using an autoencoder, which comprises a neural network that can lower the dimensionality of the sensor data. In various applications, the neural network can comprise a bottleneck architecture that provides for the autoencoder reducing the dimensionality of the sensor data. A decoder can be used for scene reconstruction to enable a comparison between the encoded sensor data and the original sensor data, where the loss comprises the difference between the original and the reconstruction. The data "compression" can comprise the smaller resultant dimensions from the autoencoder, which can result in fewer units of memory being required for storing the data. In some examples, a variational autoencoder is executed on-board the vehicles so that normal distribution resampling along with KL divergence loss can cause the encoded compression to lie only on the observed data's possibilities. It is contemplated that the use of a variational autoencoder on vehicles can further enhance compression due to memory not being wasted on data that is not useful, or data that would resemble noise. Thus, the use of the term "autoencoder" throughout the present disclosure can refer to a neural network (either general autoencoder, variational autoencoder, or other learning-based encoder) that performs the dimensionality reduction and/or data compression techniques described herein.

According to embodiments described herein, each of the vehicles can include an on-board computing system operating an autoencoder that compresses the collected sensor data from the sensor suite of the vehicle. In certain implementations, the autoencoder can perform sensor fusion on the sensor data from the multiple sensor types of the sensor suite, and can generate an encoded, compressed representation of the sensor fusion-based data for storage. In various examples, the autoencoder on-board the vehicles and the learnable decoders on the backend computing system can comprise a unified neural network architecture in which the autoencoder captures various types of invariancies in the sensor data such that multiple decoders on the backend can decompress the sensor data for their respective tasks (e.g., NeRF reconstruction, scene understanding, object detection and classification, etc.). In particular, each of the vehicles can include a unified autoencoder that is compatible or otherwise collects and encodes the sensor data in a manner that meets the requirements or goals of each of the multiple learnable decoders that performs a particular task using the encoded sensor data.

In various implementations, the compressed, sensor fusion-based data can be physically uploaded to the backend after a sensor data collection period, or can be transmitted wirelessly over one or more networks (e.g., Wi-Fi, cellular, etc.). It is contemplated that the autoencoder can be provided on normal, consumer-driven vehicles in which the original equipment manufacturer (OEM) produces vehicles having the necessary sensor modules (e.g., LIDAR, radar, and camera modules). As such, vast amounts of sensor fusion-based data can be captured, efficiently encoded, compressed, and uploaded to backend computing systems that run the learnable decoders.

Among other benefits, the examples described herein achieve a technical effect of reducing the burden on existing storage methods on the vehicles, and significantly reducing required bandwidth for uploading data to backend computing systems.

In certain implementations, the computing system can perform one or more functions described herein using a learning-based approach, such as by executing an artificial neural network (e.g., a recurrent neural network, convolutional neural network, etc.) or one or more machine-learning models to process the respective set of trajectories and classify the driving behavior of each human-driven vehicle through the intersection. Such learning-based approaches can further correspond to the computing system storing or including one or more machine-learned models. In an embodiment, the machine-learned models may include an unsupervised learning model. In an embodiment, the machine-learned models may include neural networks (e.g., deep neural networks) or other types of machine-learned models, including non-linear models and/or linear models. Neural networks may include feed-forward neural networks, recurrent neural networks (e.g., long short-term memory recurrent neural networks), convolutional neural networks or other forms of neural networks. Some example machine-learned models may leverage an attention mechanism such as self-attention. For example, some example machine-learned models may include multi-headed self-attention models (e.g., transformer models).

As provided herein, a "network" or "one or more networks" can comprise any type of network or combination of networks that allows for communication between devices. In an embodiment, the network may include one or more of a local area network, wide area network, the Internet, secure network, cellular network, mesh network, peer-to-peer communication link or some combination thereof and may include any number of wired or wireless links. Communication over the network(s) may be accomplished, for instance, via a network interface using any type of protocol, protection scheme, encoding, format, packaging, etc.

As further provided herein, an "autonomy map" or "autonomous driving map" can comprise a ground truth map recorded by a mapping vehicle using various sensors (e.g., LIDAR sensors and/or a suite of cameras or other imaging devices) and labeled (manually or automatically) to indicate traffic objects and/or right-of-way rules at any given location. In variations, an autonomy map can involve reconstructed scenes using decoders from encoded sensor data recorded and compressed by vehicles. For example, a given autonomy map can be human-labeled based on observed traffic signage, traffic signals, and lane markings in the ground truth map. In further examples, reference points or other points of interest may be further labeled on the autonomy map for additional assistance to the autonomous vehicle. Autonomous vehicles or self-driving vehicles may then utilize the labeled autonomy maps to perform localization, pose, change detection, and various other operations required for autonomous driving on public roads. For example, an autonomous vehicle can reference an autonomy map for determining the traffic rules (e.g., speed limit) at the vehicle's current location, and can dynamically compare live sensor data from an on-board sensor suite with a corresponding autonomy map to safely navigate along a current route.

One or more examples described herein provide that methods, techniques, and actions performed by a computing device are performed programmatically, or as a computer implemented method. Programmatically, as used herein, means through the use of code or computer-executable instructions. These instructions can be stored in one or more memory resources of the computing device. A programmatically performed step may or may not be automatic.

One or more examples described herein can be implemented using programmatic modules, engines, or components. A programmatic module, engine, or component can include a program, a sub-routine, a portion of a program, or a software component or a hardware component capable of performing one or more stated tasks or functions. As used herein, a module or component can exist on a hardware component independently of other modules or components. Alternatively, a module or component can be a shared element or process of other modules, programs or machines.

Some examples described herein can generally require the use of computing devices, including processing and memory resources. For example, one or more examples described herein may be implemented, in whole or in part, on computing devices such as servers and/or personal computers using network equipment (e.g., routers). Memory, processing, and network resources may all be used in connection with the establishment, use, or performance of any example described herein (including with the performance of any method or with the implementation of any system).

Furthermore, one or more examples described herein may be implemented through the use of instructions that are executable by one or more processors. These instructions may be carried on a non-transitory computer-readable medium. Machines shown or described with figures below provide examples of processing resources and computer-readable mediums on which instructions for implementing examples disclosed herein can be carried and/or executed. In particular, the numerous machines shown with examples of the invention include processors and various forms of memory for holding data and instructions. Examples of non-transitory computer-readable mediums include permanent memory storage devices, such as hard drives on personal computers or servers. Other examples of computer storage mediums include portable storage units, such as flash memory or magnetic memory. Computers, terminals, network-enabled devices are all examples of machines and devices that utilize processors, memory, and instructions stored on computer-readable mediums. Additionally, examples may be implemented in the form of computer-programs, or a computer usable carrier medium capable of carrying such a program.

Example Computing System

FIG. 1 is a block diagram depicting an example computing system 100 implementing data compression and/or learnable decoding methods for tasks such as scene reconstruction and understanding, according to examples described herein. In an embodiment, the computing system 100 can include a control circuit 110 that may include one or more processors (e.g., microprocessors), one or more processing cores, a programmable logic circuit (PLC) or a programmable logic/gate array (PLA/PGA), a field programmable gate array (FPGA), an application specific integrated circuit (ASIC), or any other control circuit. In some implementations, the control circuit 110 and/or computing system 100 may be part of, or may form, a vehicle control unit (also referred to as a vehicle controller) that is embedded or otherwise disposed in a vehicle (e.g., a Mercedes-Benz® car or van). For example, the vehicle controller may be or may include an infotainment system controller (e.g., an infotainment head-unit), a telematics control unit (TCU), an electronic control unit (ECU), a central powertrain controller (CPC), a central exterior & interior controller (CEIC), a zone controller, or any other controller (the term "or" is used herein interchangeably with "and/or"). In variations, the control circuit 110 and/or computing system 100 can be included on one or more servers (e.g., backend servers).

In an embodiment, the control circuit 110 may be programmed by one or more computer-readable or computer-executable instructions stored on the non-transitory computer-readable medium 120. The non-transitory computer-readable medium 120 may be a memory device, also referred to as a data storage device, which may include an electronic storage device, a magnetic storage device, an optical storage device, an electromagnetic storage device, a semiconductor storage device, or any suitable combination thereof. The non-transitory computer-readable medium 120 may form, e.g., a computer diskette, a hard disk drive (HDD), a solid state drive (SDD) or solid state integrated memory, a random access memory (RAM), a read-only memory (ROM), an erasable programmable read-only memory (EPROM or Flash memory), a static random access memory (SRAM), dynamic random access memory (DRAM), a portable compact disc read-only memory (CD-ROM), a digital versatile disk (DVD), and/or a memory stick. In some cases, the non-transitory computer-readable medium 120 may store computer-executable instructions or computer-readable instructions, such as instructions to perform the below methods described in connection with of FIGS. 4A, 4B, 5A, and 5B.

In various embodiments, the terms "computer-readable instructions" and "computer-executable instructions" are used to describe software instructions or computer code configured to carry out various tasks and operations. In various embodiments, if the computer-readable or computer-executable instructions form modules, the term "module" refers broadly to a collection of software instructions or code configured to cause the control circuit 110 to perform one or more functional tasks. The modules and computer-readable/executable instructions may be described as performing various operations or tasks when a control circuit 110 or other hardware component is executing the modules or computer-readable instructions.

In further embodiments, the computing system 100 can include a communication interface 140 that enables communications over one or more networks 150 to transmit and receive data. In backend system examples, the computing system 100 can communicate, over the one or more networks, with fleet vehicles using the communication interface 140 to receive compressed sensor data and implement the learnable decoder methods described throughout the present disclosure. In vehicle examples, the computing system 100 can communicate, over the one or more networks 150, with a backend computing system to transmit compressed sensor data in accordance with the embodiments described herein. In certain embodiments, the communication interface 140 may be used to communicate with one or more other systems. The communication interface 140 may include any circuits, components, software, etc. for communicating via one or more networks 150 (e.g., a local area network, wide area network, the Internet, secure network, cellular network, mesh network, and/or peer-to-peer communication link). In some implementations, the communication interface 140 may include for example, one or more of a communications controller, receiver, transceiver, transmitter, port, conductors, software and/or hardware for communicating data/information.

As an example embodiment, the computing system 100 can reside on-board a vehicle, and can receive sensor data from a sensor suite of the vehicle. The computing system 100 can execute an autoencoder to fuse and compress the sensor data based on the various tasks or purposes of a set of learnable decoders that execute on one or more backend computing systems. In doing so, the autoencoder can automatically discard unusable data, encode different data sets in different manners, and otherwise compress the sensor data. Further description of the vehicle computing system embodiments is provided below in connection with FIG. 2.

System Descriptions

Figure 2:
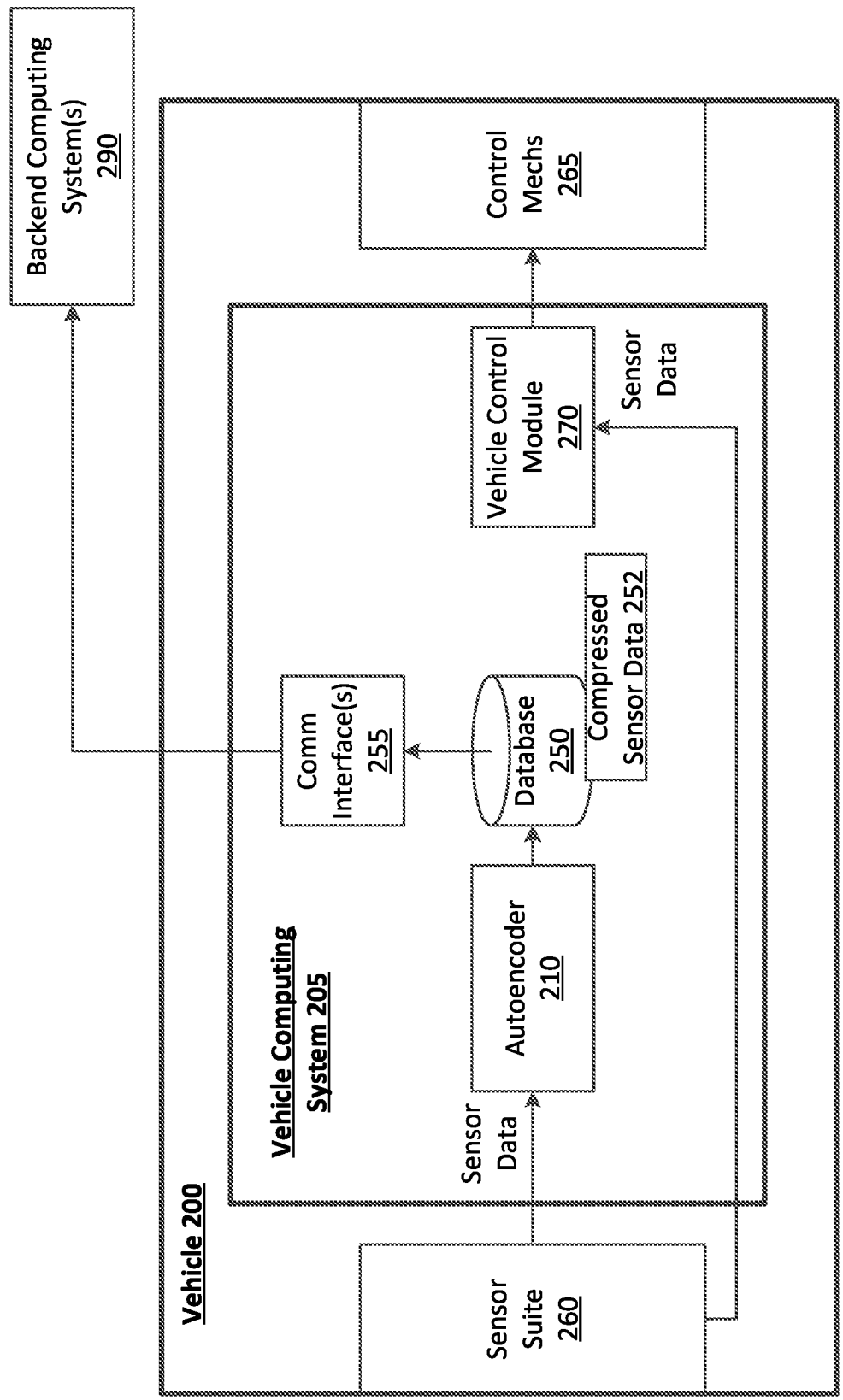
FIG. 2 is a block diagram illustrating an example vehicle computing system including a autoencoder, according to examples described herein.

FIG. 2 is a block diagram illustrating vehicle 205 that includes an example vehicle computing system 205 including an autoencoder 210, according to examples described herein. As provided herein, the vehicle computing system 205 can be included on a consumer-driven vehicle, which can comprise any vehicle manufactured by an OEM or modified to include a sensor suite 260 comprising a set of sensors, such as image sensors (e.g., cameras), LIDAR sensors, radar sensors, ultrasonic sensors, etc. Additionally or alternatively, the vehicle computing system 205 can be included on a specialized mapping vehicle that operates to collect ground truth sensor data of a road network for generating autonomy maps for autonomous vehicle operation on the road network.

As provided herein, the autoencoder 210 can comprise an artificial neural network that operates to effectively encode the raw sensor data (e.g., using unsupervised learning techniques). In certain examples, the autoencoder 210 can implement machine learning techniques to learn an optimal representation or encoding method for the raw sensor data (e.g., perform dimensionality reduction, automatically discard unusable or insignificant data, etc.). It is contemplated herein that the autoencoder 210 performs these optimized encoding methods (e.g., dimensionality reduction and/or automatic discarding of certain data) based on the tasks to be performed by a set of learnable decoders that execute on the encoded sensor data on one or more backend computing systems, as described below with respect to FIG. 3.

The vehicle 200 housing the vehicle computing system 205 can operate throughout a road network, and the sensor suite 260 can collect sensor data. In one example, the sensor data can comprise video or image data captured by one or more cameras. In additional examples, the sensor data can comprise LIDAR data captured by one or more LIDAR sensors of the sensor suite 260. In variations, the sensor data can comprise a combination of sensor data from a plurality of sensor types, such as a combination of LIDAR data, video or image data, and radar data from corresponding LIDAR sensors, image sensors, and radar sensors of the sensor suite 260.

The vehicle computing system 205 can include a autoencoder 210 that encodes or compresses the sensor data. In various implementations, the autoencoder 210 can perform sensor fusion on the multiple types of sensor data, and encode and compress the sensor fusion-based data (e.g., reduce the spatial dimension of the three-dimensional sensor data) in accordance with a set of tasks of a set of decoders. As described herein, the set of decoders can execute on a backend computing system to decompress the sensor data and perform scene understanding, object detection and/or classification, segmentation, or scene reconstruction tasks based on the encoded sensor data. As such, the autoencoder 210 can be trained to discard acquired sensor data that is not needed for the decoder tasks. For example, the autoencoder 210 can discard background data (e.g., background landscapes, foliage, certain buildings, the sky, etc.) to further reduce that amount to data to be stored.

In various examples, the vehicle computing system 205 includes a database 250 that can store the compressed sensor data 252 until the data 252 can be uploaded to one or more backend computing systems 290. As such, the vehicle computing system 205 can include one or more communication interfaces 255 (e.g., wireless network interface and/or wired data transmission port) for transmitting or otherwise uploading the compressed sensor data 252. It is contemplated that such an arrangement can result in vastly more information being stored in the database 250 for the subsequent tasks performed by the learnable decoders, and reduce the necessary bandwidth for transmitting or uploading the data to the backend computing system(s) 290.

In certain implementations, the autoencoder 210 can be standardized or otherwise unified such that the autoencoder 210 encodes and compresses the sensor data to preserve information needed for all the tasks of the learnable decoders. Thus, when encoded and compressed in latent space, the compressed sensor data 252 can contain substantially all information required for the multiple tasks of the set of decoders. It is contemplated that the autoencoder 210 can be trained over time based on results or effectiveness of the decoders to gather sufficient variance in the sensor data such that the encoded representation (i.e., compressed sensor data 252) can be processed by each of the decoders to effectively perform their respective tasks.

In various examples, the vehicle computing system 205 can include a vehicle control module 270, which in certain examples, can dynamically analyze the sensor data. In some embodiments, the vehicle control module 270 can comprise an advanced driver assistance system which can analyze the sensor data to perform driver assist functions, such as adaptive cruise control, emergency brake assist, lane-keeping, lane centering, highway drive assist, autonomous obstacle avoidance, and/or autonomous parking tasks. As such, the vehicle control module 270 can operate a set of control mechanisms 265 of the vehicle to perform these tasks. As provided herein, the control mechanisms 265 can comprise a steering system, braking system, acceleration system, and/or signaling and auxiliary system of the vehicle 205.

In variations, the vehicle control module 270 can include an autonomous motion planning module to automatically decide a sequence of immediate motion plans for the vehicle 200 along a travel route based on the sensor data and operate the control mechanisms 265 of the vehicle 200 to autonomously drive the vehicle 200 along the travel route in accordance with the immediate motion plans. For such autonomous driving operations, the vehicle control module 270 can perform scene understanding tasks, such as determining occupancy in a grid-based map of a surrounding environment of the vehicle 205, performing object detection and classification tasks, determining right-of-way rules in any given situation, and/or generally determining various aspects of the road infrastructure, such as detecting lane markings, road signage, traffic signals, etc., determining lane and road topology, identifying crosswalks, bicycle lanes, and the like, in order to autonomously operate along the travel route.

Figure 3:
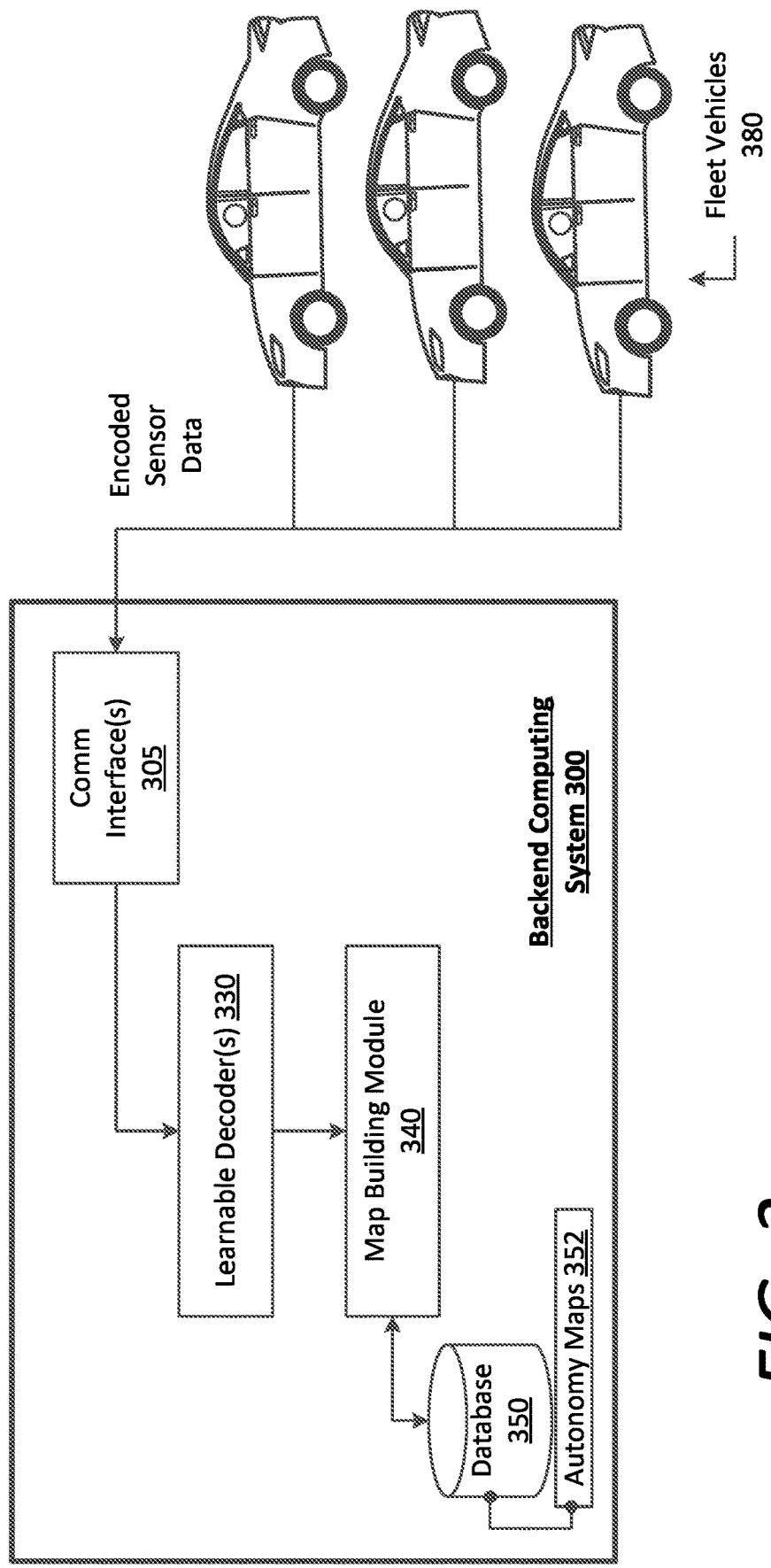
FIG. 3 is a block diagram illustrating an example backend computing system including one or more learnable decoders, according to examples described herein.

FIG. 3 is a block diagram illustrating an example backend computing system 300 including one or more learnable decoders 330, according to examples described herein. The backend computing system 300 described in connection with FIG. 3 can correspond to one of the backend computing systems 290 as shown and described with respect to FIG. 2. Furthermore, the learnable decoders 330 can be executed on a single computing system 300, or multiple computing systems. As such the backend computing system 300 described in connection with FIG. 3 comprises an example computing system that can execute one or more learnable decoders to perform the decoder task(s) described herein.

Referring to FIG. 3, the backend computing system 300 can include one or more communication interfaces 305 (e.g., a wireless network interface and/or wired data transmission port) that enable the backend computing system 300 to receive encoded sensor data from fleet vehicles 380 operating throughout a road network. As provided herein, the fleet vehicles 380 can comprise consumer driver vehicles having the necessary sensor suite 260 and autoencoder 210 to acquire and compress sensor data in accordance with the tasks of the learnable decoders 330. In further examples, the fleet vehicles 380 can include specialized mapping vehicles that include sensor suites 260 and autoencoder 210, in accordance with the examples described with respect to FIG. 2.

As further provided herein, the learnable decoders 330 can process the encoded sensor data to perform tasks such as any combination of image classification, object detection and classification, localization, change detection, scene segmentation, instance segmentation, and scene understanding tasks for facilitating eventual autonomous vehicle operation on the road network. These tasks can comprise the identification, classification, and interpretation of objects such as road and lane markings, road signage, traffic signals and signaling infrastructure, pedestrian crosswalks, parking spaces, parked vehicles, pedestrians, bicycle lanes, bicyclists, points of interest, right-of-way determination, and the like. Such tasks may be performed through direct interpretation of the encoded sensor data. As such, the autoencoder 210 provided on-board the fleet vehicles 380 can be trained to encode sensor data (e.g., discard sensor data unneeded by the decoders 330 and compress the remaining sensor data) in accordance with each task to be performed by the learnable decoders, such that the data loss in the encoding process does not substantially prohibit or inhibit any of the learnable decoders in performing their respective tasks effectively.

Additionally or alternatively, the learnable decoders 330 can be executed on the encoded sensor data to perform scene reconstruction (e.g., NeRF reconstruction) based on the encoded sensor data. An example of scene reconstruction based on encoded, compressed sensor data involves the reconstruction of three or four-dimensional scenes from two-dimensional images comprising captured data from multiple perspectives. In the examples described herein, the encoded sensor data can comprise compressed sensor fusion data from multiple sensor types (e.g., radar, LIDAR, and image) that dynamically capture the surrounding environment of the fleet vehicle 380. The learnable decoder 330 can execute on the compressed, sensor fusion-based data to generate a reconstruction or simulation of the path traveled by the fleet vehicle 380 including the surrounding environment of the fleet vehicle 380.

The various tasks by the learnable decoders 330 may be performed for the purpose of training autonomous vehicles to safely operate throughout the road network. In further implementations, the reconstruction of the road network based on the encoded sensor data (e.g., via NeRF reconstruction) can be performed for autonomy map building purposes to support autonomous vehicle operation. In such implementations, the backend computing system 300 can include a map building module 340 that can generate labeled autonomy maps 352 that can be utilized by autonomous vehicles for operating throughout the road network. The map building module 340 can leverage the tasks performed by the learnable decoders 330 to automatically label the reconstructed scenes (e.g., indicating road signage and signals, classified objects, lane markings, etc.) to generate the autonomy maps 352 for autonomous driving purposes.

For example, an autonomous vehicle may include a sensor suite to visualize a surrounding environment of the autonomous vehicle in real-time. The autonomous vehicle can include one or more autonomy maps 352 that the computing system of the autonomous vehicle dynamically references to perform localization, pose, object detection and classification, change detection, and motion planning operations in order to safely travel along a route autonomously. It is contemplated herein that the autonomy maps 352 may be based on reconstructed scenes using the encoded sensor data from the autoencoder 210 executing on the fleet vehicles 380. The backend computing system 300 can include a database 350 storing the autonomy maps 352 generated by the map building module 340 for subsequent uploading to autonomous vehicles.

In certain examples, the autonomy maps 352 can be automatically generated by the map building module 340 and/or may be supplemented with manual, human labeling or verification. It is contemplated that generating autonomy maps 352 using reconstructed scenes (e.g., via NeRF reconstruction) can significantly reduce the necessary computing power, bandwidth, cost, and storage space in the vehicle computing system 205 and backend computing system 300 arrangements described herein.

Methodology

Figure 4A:
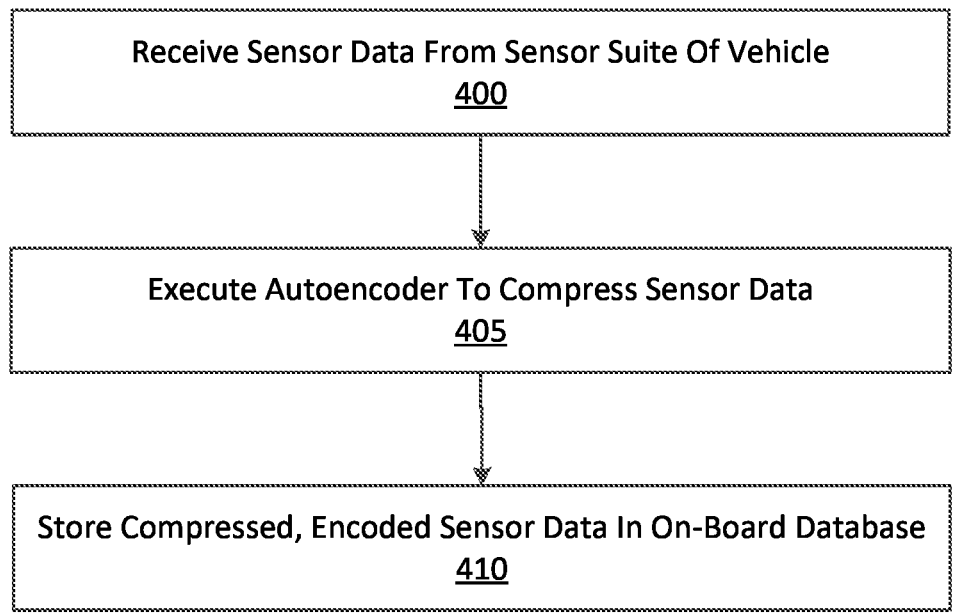
FIGS. 4A and 4B are flow charts describing example methods of compressing sensor data on-board a vehicle, according to examples described herein.
Figure 4B:
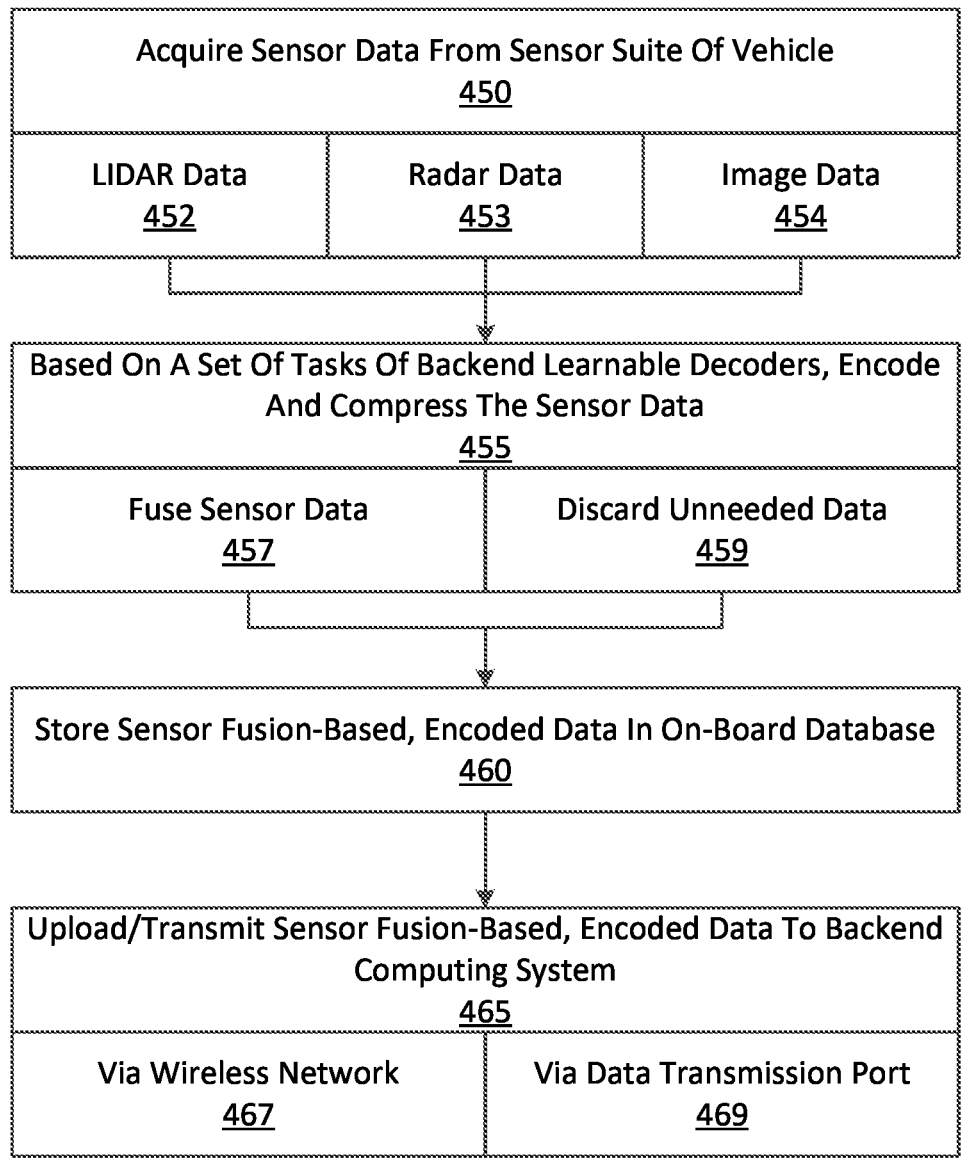
Figure 5A:
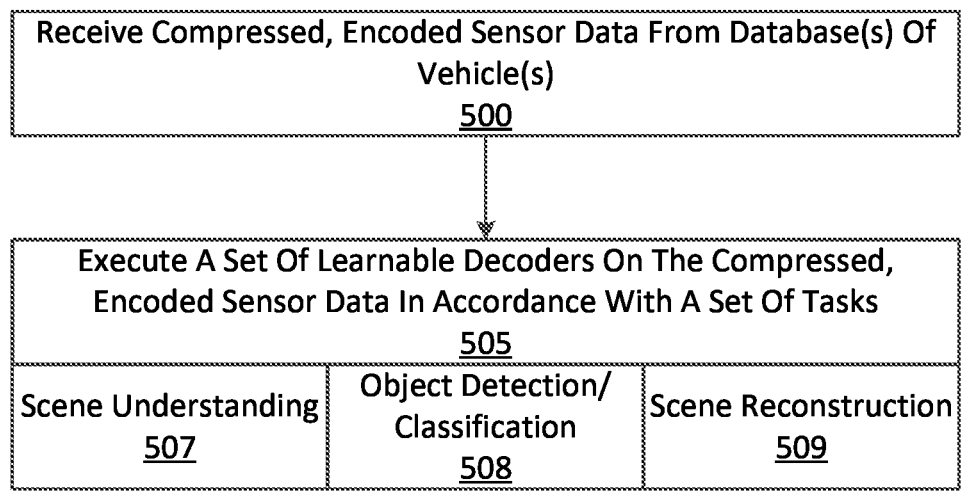
FIGS. 5A and 5B are flow charts describing example methods of decoding compressed data from vehicles, according to examples described herein.
Figure 5B:
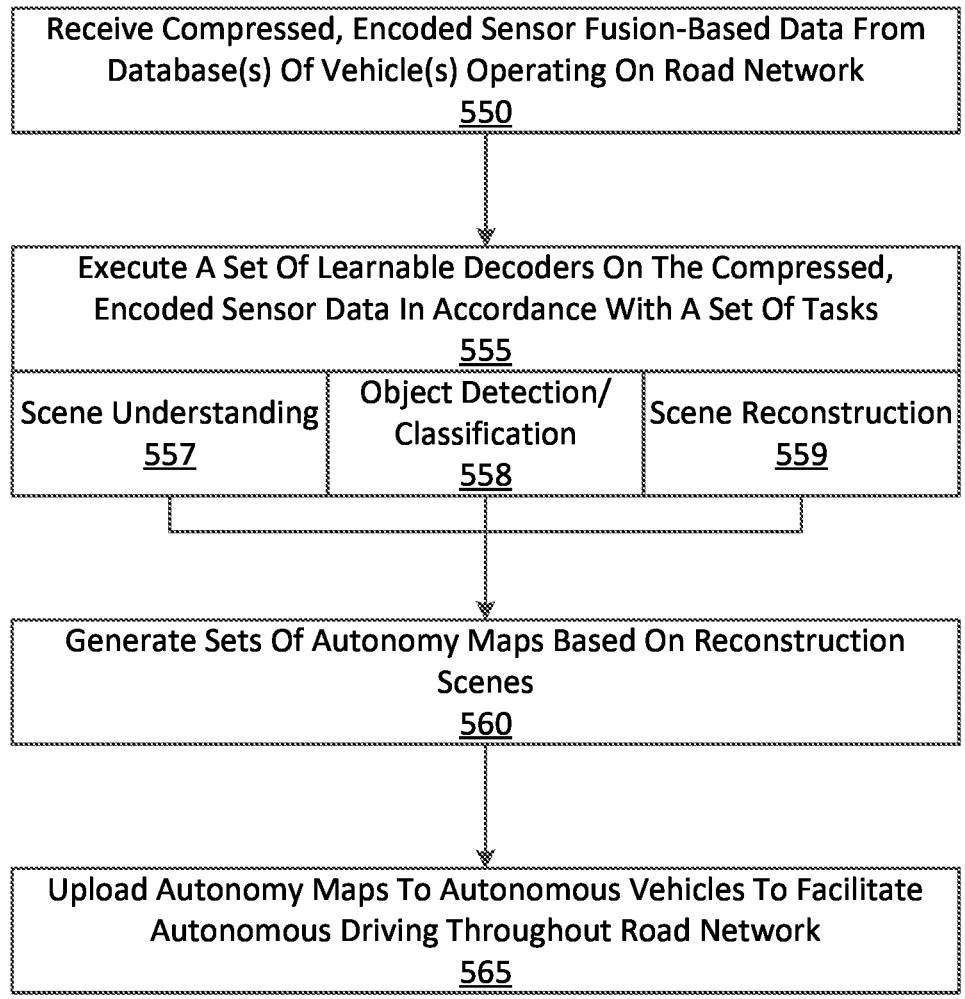

FIGS. 4A and 4B are flow charts describing example methods of compressing sensor data on-board a vehicle, according to examples described herein. FIGS. 5A and 5B are flow charts describing example methods of decoding compressed data from vehicles, according to examples described herein. In the below descriptions of FIGS. 4A, 4B, 5A, and 5B, reference may be made to reference characters representing various features as shown and described with respect to FIGS. 1 through 3. Furthermore, the processes described in connection with FIGS. 4A, 4B, 5A, and 5B may be performed by example vehicle computing systems 205 as described with respect to FIG. 2 or the backend computing system 300 as described with respect to FIG. 3. Further still, certain steps described with respect to the flow charts of FIGS. 4A, 4B, 5A, and 5B may be performed prior to, in conjunction with, or subsequent to any other step, and need not be performed in the respective sequences shown.

Referring to FIG. 4A, at block 400, a vehicle computing system 205 can receive sensor data from a sensor suite 260 of the vehicle. At block 405, the vehicle computing system 205 can execute a autoencoder 210 to encode and compress the sensor data. At block 410, the vehicle computing system 205 can store the compressed, encoded sensor data 252 in an on-board database 250. As such, the vehicle computing system 205 can capture significantly more usable data corresponding to a road network on which the vehicle operates for later processing by a set of learnable decoders.

FIG. 4B is a flow chart describing another example method of compressing sensor data on-board a vehicle. Referring to FIG. 4B, at block 450, the on-board vehicle computing system 205 can acquire sensor data from a sensor suite 260 of the vehicle. As described herein, the sensor data can comprise a combination of LIDAR data, at block 452, radar data, at block 453, and image data, at block 454, which can be acquired from respective LIDAR sensors, radar sensors, and image capturing devices of the sensor suite 260 of the vehicle. At block 455, the vehicle computing system 205 can execute a autoencoder 210 to encode and compress the sensor data based on a set of tasks to be performed by a set of backend, learnable decoders 330. At block 457, the autoencoder 210 can fuse the combination of sensor data, which can comprise the combination LIDAR data, image data, and the radar data. At block 459, the autoencoder 210 can further discard sensor data that is not needed by the learnable decoders 330.

At block 460, the vehicle computing system 205 can store the sensor fusion-based, encoded data 252 in an on-board database 250. After a sensor data gathering period, at block 465, the vehicle computing system 205 can upload or transmit the sensor fusion-based, encoded data 252 to a backend computing system 300. In certain aspects, the sensor data gathering period can correspond to a preplanned route, multiple preplanned routes, normal vehicle operation by a consumer-driver, the storage space of the on-board database 250, and the like. As such, the encoded sensor data 252 may be uploaded during normal, periodic service of the vehicle, or can be obtained through wireless data transmission (e.g., when the free storage space of the on-board database 250 is reduced beyond a threshold limit). As described herein, at block 467, the encoded sensor data 252 can be transmitted to the backend computing system 300 via one or more wireless networks, and/or, at block 469, can be transmitted directly via a wired data transmission port.

FIGS. 5A and 5B describe example methods of treating the encoded sensor data 252 by backend computing systems 300. Referring to FIG. 5A, at block 500, a backend computing system 300 can receive compressed, encoded sensor data from the database(s) 250 of one or more vehicles operating throughout a road network. At block 505, the backend computing system 300 can execute a set of one or more learnable decoders 330 on the compressed, encoded sensor data in accordance with a set of learned tasks of the decoders 330. As described throughout the present disclosure, these tasks can comprise scene understanding tasks, at block 507, object detection and/or classification tasks, at block 508, and/or scene reconstruction tasks, at block 509.

FIG. 5B describes another example method of decoding compressed, encoded data from vehicles. Referring to FIG. 5B, at block 550, the backend computing system 300 can receive compressed and encoded, sensor fusion-based data from the database(s) 250 of one or more vehicles operating throughout a road network. As described herein, the encoded sensor fusion-based data can comprise a combination of LIDAR data captured by one or more LIDAR sensors, radar data captured by one or more radar sensors, and image data captured by one or more cameras of the vehicle(s). In various example, at block 555, the backend computing system 300 can execute a set of learnable decoders on the compressed, encoded, sensor fusion-based data in accordance with their respective tasks, which can comprise scene understanding tasks, at block 557, object detection and/or classification tasks, at block 558, and/or scene reconstruction tasks, at block 559, as described above.

In certain implementations, at block 560, the backend computing system 300 can generate a set of autonomy maps 352 based on reconstructed scenes (e.g., NeRF reconstructed scenes) by the learnable decoders 330. As described above, the autonomy maps 352 can be utilized by autonomous vehicles for automated operation and driving throughout a road network. The autonomy maps may be automatically labeled by a map building module 340 of the backend computing system 300 and/or can be labeled elsewhere. At block 565, the backend computing system 300 can upload the generated autonomy maps 352 to autonomous vehicles to facilitate autonomous driving throughout the road network.

It is contemplated for examples described herein to extend to individual elements and concepts described herein, independently of other concepts, ideas or systems, as well as for examples to include combinations of elements recited anywhere in this application. Although examples are described in detail herein with reference to the accompanying drawings, it is to be understood that the concepts are not limited to those precise examples. As such, many modifications and variations will be apparent to practitioners skilled in this art. Accordingly, it is intended that the scope of the concepts be defined by the following claims and their equivalents. Furthermore, it is contemplated that a particular feature described either individually or as part of an example can be combined with other individually described features, or parts of other examples, even if the other features and examples make no mention of the particular feature.

What is claimed is:

1. A computing system for a vehicle, comprising:
   one or more processors;
   a memory storing instructions that, when executed by the one or more processors, cause the computing system to:
   receive sensor data from a sensor suite of the vehicle;
   execute an autoencoder, embedded in the computing system of the vehicle, on the sensor data to compress the sensor data;
   store the compressed sensor data in an on-board database of the vehicle; and
   upload or transmit the compressed sensor data to a backend computing system to facilitate scene reconstruction of a surrounding environment of the vehicle based on the compressed sensor data.

2. The computing system of claim 1, wherein the autoencoder is machine learned based on a set of tasks of a set of learnable decoders that decompress the compressed sensor data on a backend computing system.

3. The computing system of claim 2, wherein the set of tasks of the set of learnable decoders comprise at least one of scene reconstruction tasks, scene understanding tasks, or object detection tasks.

4. The computing system of claim 2, wherein the set of learnable decoders comprise a series of neural network layers on the backend computing system to perform the at least one of scene reconstruction tasks, scene understanding tasks, or object detection tasks.

5. The computing system of claim 2, wherein the autoencoder automatically removes data in the compressed sensor data based on the set of tasks of the set of learnable decoders.

6. The computing system of claim 2, wherein the autoencoder compresses the sensor data and stores the compressed sensor data in real time to (i) increase data storage in the on-board database of the vehicle, and (ii) increase bandwidth efficiency when uploading or transmitting the compressed sensor data to the backend computing system.

7. The computing system of claim 1, wherein the sensor suite comprises one or more image sensors, one or more radar sensors, and one or more LIDAR sensors, and wherein the sensor data comprises a combination of image data, radar data, and LIDAR data.

8. The computing system of claim 7, wherein the compressed sensor data by the autoencoder comprises a representation of sensor fusion-based data based on the combination of image data, radar data, and LIDAR data.

9. The computing system of claim 1, wherein the vehicle comprises one of (i) a fleet vehicle operated by a consumer-driver, or (ii) a specialized mapping vehicle that collects sensor data of a road network for generating autonomy maps for autonomous vehicle operation on the road network.

10. A non-transitory computer readable medium storing instructions that, when executed by one or more processors of a computing system of a vehicle, cause the computing system to:
receive sensor data from a sensor suite of the vehicle;
execute an autoencoder, embedded in the computing system of the vehicle, on the sensor data to compress the sensor data;
store the compressed sensor data in an on-board database of the vehicle; and
upload or transmit the compressed sensor data to a backend computing system to facilitate scene reconstruction of a surrounding environment of the vehicle based on the compressed sensor data.

11. The non-transitory computer readable medium of claim 10, wherein the autoencoder is machine learned based on a set of tasks of a set of learnable decoders that decompress the compressed sensor data on a backend computing system.

12. The non-transitory computer readable medium of claim 11, wherein the set of tasks of the set of learnable decoders comprise at least one of scene reconstruction tasks, scene understanding tasks, or object detection tasks.

13. The non-transitory computer readable medium of claim 11, wherein the set of learnable decoders comprise a series of neural network layers on the backend computing system to perform the at least one of scene reconstruction tasks, scene understanding tasks, or object detection tasks.

14. The non-transitory computer readable medium of claim 11, wherein the autoencoder automatically removes data in the compressed sensor data based on the set of tasks of the set of learnable decoders.

15. The non-transitory computer readable medium of claim 11, wherein the autoencoder compresses the sensor data and stores the compressed sensor data in real time to (i) increase data storage in the on-board database of the vehicle, and (ii) increase bandwidth efficiency when uploading or transmitting the compressed sensor data to the backend computing system.

16. The non-transitory computer readable medium of claim 10, wherein the sensor suite comprises one or more image sensors, one or more radar sensors, and one or more LIDAR sensors, and wherein the sensor data comprises a combination of image data, radar data, and LIDAR data.

17. The non-transitory computer readable medium of claim 16, wherein the compressed sensor data by the autoencoder comprises a representation of sensor fusion-based data based on the combination of image data, radar data, and LIDAR data.

18. The non-transitory computer readable medium of claim 10, wherein the vehicle comprises one of (i) a fleet vehicle operated by a consumer-driver, or (ii) a specialized mapping vehicle that collects sensor data of a road network for generating autonomy maps for autonomous vehicle operation on the road network.

19. A computer implemented method of compressing sensor data, the method being performed by one or more processors of a computing system of a vehicle and comprising:
receiving sensor data from a sensor suite of the vehicle;
executing an autoencoder, embedded in the computing system of the vehicle, on the sensor data to compress the sensor data;
storing the compressed sensor data in an on-board database of the vehicle; and
uploading or transmitting the compressed sensor data to a backend computing system to facilitate scene reconstruction of a surrounding environment of the vehicle based on the compressed sensor data.

20. The method of claim 19, wherein the autoencoder is machine learned based on a set of tasks of a set of learnable decoders that decompress the compressed sensor data on a backend computing system.

* * * * *